United States Patent
Greene et al.

(10) Patent No.: US 9,634,110 B2
(45) Date of Patent: Apr. 25, 2017

(54) POC PROCESS FLOW FOR CONFORMAL RECESS FILL

(71) Applicants: International Business Machines Corporation, Armonk, NY (US); GlobalFoundries, Inc., Grand Cayman (KY)

(72) Inventors: Andrew M. Greene, Albany, NY (US); Sanjay C. Mehta, Niskayuna, NY (US); Balasubramanian S. Pranatharthiharan, Watervliet, NY (US); Ruilong Xie, Albany, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/179,393

(22) Filed: Jun. 10, 2016

(65) Prior Publication Data

US 2017/0084712 A1    Mar. 23, 2017

Related U.S. Application Data

(62) Division of application No. 14/862,258, filed on Sep. 23, 2015.

(51) Int. Cl.
*H01L 29/49* (2006.01)
*H01L 21/8238* (2006.01)
*H01L 29/66* (2006.01)

(52) U.S. Cl.
CPC .. *H01L 29/4983* (2013.01); *H01L 21/823814* (2013.01); *H01L 21/823821* (2013.01);
(Continued)

(58) Field of Classification Search
None
See application file for complete search history.

(56) References Cited

U.S. PATENT DOCUMENTS 9,406,767 B1 *   8/2016  Greene ............ H01L 29/42368
2014/0203376 A1 * 7/2014  Xie ................. H01L 21/76224
                                                         257/401

OTHER PUBLICATIONS

Greene, Andrew M., et al.; "New POC Process Flow for Conformal Recess Fill"; U.S. Appl. No. 14/862,258, filed Sep. 23, 2015.
(Continued)

*Primary Examiner* — Thao P Le
(74) *Attorney, Agent, or Firm* — Cantor Colburn LLP; Vazken Alexanian

(57) ABSTRACT

A method of filling trenches between gates includes forming a first and a second dummy gate over a substrate, the first and second dummy gates including a sacrificial gate material and a hard mask layer; forming a first gate spacer along a sidewall of the first dummy gate and a second gate spacer along a sidewall of the second dummy gate; performing an epitaxial growth process to form a source/drain on the substrate between the first and second dummy gates; disposing a conformal liner over the first and second dummy gates and the source/drain; disposing an oxide on the conformal liner between the first and second dummy gates; recessing the oxide to a level below the hard mask layers of the first and second dummy gates to form a recessed oxide; and depositing a spacer material over the recessed oxide between the first dummy gate and the second dummy gate.

13 Claims, 13 Drawing Sheets

(52) U.S. Cl.
CPC ........... *H01L 21/823842* (2013.01); *H01L 21/823864* (2013.01); *H01L 29/66545* (2013.01)

(56) References Cited

OTHER PUBLICATIONS

Greene, Andrew M., et al.; "New POC Process Flow for Conformal Recess Fill"; U.S. Appl. No. 15/073,050, filed Mar. 17, 2016.
List of IBM Patents or Patent Applications Treated as Related—Date Filed: Jun. 29, 2016; 2 pages.

\* cited by examiner

POC PROCESS FLOW FOR CONFORMAL RECESS FILL

DOMESTIC PRIORITY

This application is a divisional of and claims priority from U.S. patent application Ser. No. 14/862,258, filed on Sep. 23, 2015, entitled "NEW POC PROCESS FLOW FOR CONFORMAL RECESS FILL", the entire contents of which are incorporated herein by reference.

BACKGROUND

The present invention relates to metal-oxide-semiconductor field-effect transistors (MOSFET), and more specifically, to recess filling methods and devices.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

The FinFET is a type of MOSFET. The FinFET is a double-gate device that mitigates the effects of short channels and reduces drain-induced barrier lowering. The "fin" refers to the narrow channel between source and drain regions. A thin insulating oxide layer on either side of the fin separates the fin from the gate.

SUMMARY

According to an embodiment, a method of filling trenches between gates includes forming a first dummy gate and a second dummy gate over a substrate, the first dummy gate and the second dummy gate including a sacrificial gate material and a hard mask layer disposed over the sacrificial gate material; forming a first gate spacer along a sidewall of the first dummy gate and a second gate spacer along a sidewall of the second dummy gate; performing an epitaxial growth process to form a source/drain on the substrate between the first dummy gate and the second dummy gate; disposing a conformal liner over the first dummy gate, the second dummy gate, and the source/drain; disposing an oxide on the conformal liner between the first dummy gate and the second dummy gate; recessing the oxide to a level below the hard mask layers of the first dummy gate and the second dummy gate to form a recessed oxide; and depositing a spacer material over the recessed oxide between the first dummy gate and the second dummy gate.

According to another embodiment, a method of filling trenches between gates includes forming a first dummy gate and a second dummy gate over a substrate, the first dummy gate and the second dummy gate including a sacrificial gate material and a hard mask layer on the sacrificial gate material; forming a first gate spacer along a sidewall of the first dummy gate and a second gate spacer along a sidewall of the second dummy gate; performing an epitaxial growth process to form a source/drain on the substrate between the first dummy gate and the second dummy gate; disposing a conformal liner over the first dummy gate, the second dummy gate, and the source/drain; disposing an oxide on the conformal liner between the first dummy gate and the second dummy gate; recessing the oxide to a level below the hard mask layer on the first dummy gate and the second dummy gate to form a recessed oxide; disposing a spacer material layer over the recessed oxide and the hard mask layer; disposing a planarization layer over the spacer material layer; and performing a planarization process to remove the planarization layer and a portion of the spacer material layer and to expose the hard mask layer.

Yet, according to another embodiment, a semiconductor device includes a first gate and a second gate disposed over a substrate; a first gate spacer arranged along a sidewall of the first gate and a second gate spacer arranged along a sidewall of the second gate; a source/drain disposed over the substrate and between the first gate and the second gate; a liner arranged between the first gate and the second gate, the liner being in contact with the first gate spacer, the second gate spacer, and the source/drain; a recessed oxide disposed within a region between the first gate and the second gate and in contact with a portion of the liner over the source/drain; and a spacer material disposed over the recessed oxide and between the first gate and the second gate.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A-10B illustrate exemplary methods of making semiconductor devices according to various embodiments, in which:

FIG. 2A is a cross-sectional side view of dummy gates formed over a substrate;

FIG. 3 is a cross-sectional side view after forming active regions and gate spacers along a sidewall of the dummy gates;

FIG. 4 is a cross-sectional side view after disposing a conformal liner over the dummy gates;

FIG. 5 is a cross-sectional side view after disposing an oxide layer around and between the dummy gates;

FIG. 6 is a cross-sectional side view after selectively recessing the oxide layer;

FIG. 7 is a cross-sectional side view after disposing a layer including a spacer material and a planarization oxide layer over the dummy gates;

FIG. 8 is a cross-sectional side view after performing a planarization process to expose the hard mask layer over the dummy gates;

FIG. 9 is a cross-sectional side view after selectively removing the hard mask layer over the dummy gates;

FIG. 10B is a cross-sectional side view filling the gates with a high-k metal gate stack;

DETAILED DESCRIPTION

As devices scale to smaller dimensions, the gate pitch may prevent complete trench filling between the gates. Oxides, for example, flowable oxides (FOX), for example, may be deposited as an inter-level dielectric (ILD) layer to fill narrow gate trenches/high aspect ratios. However, poor quality oxides may be porous. Therefore, the oxides may exhibit high wet etch rates, as well as high "dishing" rates during chemical mechanical planarization (CMP). "Dishing" relates to the amount of material removed during CMP. Tight pitch replacement gates, for example, have less dishing (less material is removed) than large pitch gates because of the larger exposed surface area (more material is removed).

Figure 1B:
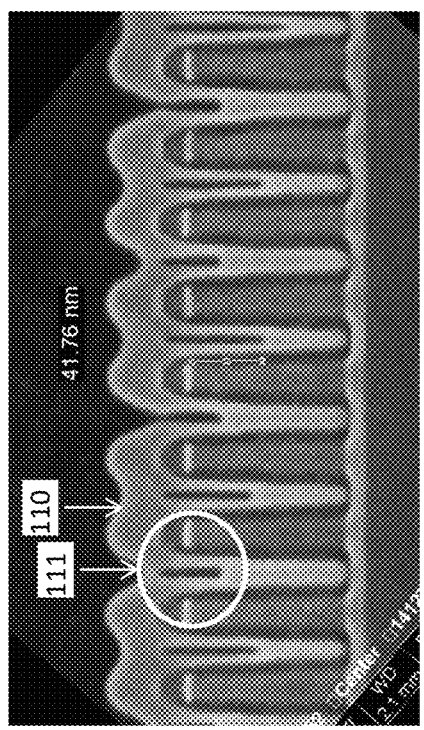
FIG. 1B is an electron micrograph image showing voids formed after depositing a high density plasma (HDP) oxide over the recessed FOX of FIG. 1A.
Figure 1A:
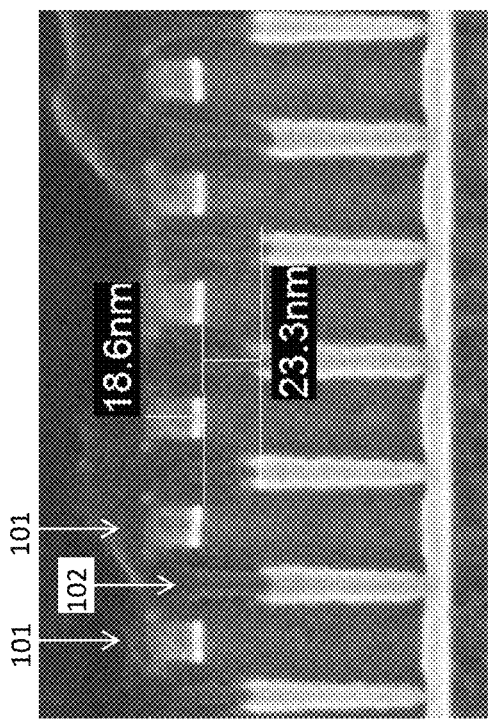
FIG. 1A is an electron micrograph image showing recessed flowable oxide (FOX) between gates.

After recessing the oxides between gates, a higher quality oxide, for example, high density plasma (HDP) oxide, may be used to fill the spaces between the gates. However, when HDP oxides are deposited into high aspect ratio trenches between gates, voids may form between the gates. The gate spacers and hard mask layers around the gates also may be damaged. For example, FIG. 1A is an electron micrograph image showing recessed FOX 102 between gates 101. FIG. 1B shows HDP oxide 110 filling the recessed FOX 102 of FIG. 1A, with voids 111 formed between the gates 101. The voids 111 shown in FIG. 1B represent an extreme case.

Oxide voiding between gates may cause downstream process challenges. For example, the voids may induce metal gate aggregates that cause electrical shorting. The voids also may interfere with self-aligned contact etching rates, e.g., under etching, over etching, and epitaxial growth/fin reactive ion etching (RIE) plasma damage. The voids may further induce non-uniformity in gate heights across the wafer.

Accordingly, various embodiments described herein provide a trench filling process between gates that maintains an intact gate profile and substantially completely fills recessed oxide trenches without voids. The methods include a conformal deposition process that fills high aspect ratio trenches with a spacer material (e.g., SiBCN) without damaging dummy gate spacers or hard masks. The spacer material has a high etch rate resistance to both wet and dry etch processes. The conformal deposition process is combined with a selective oxide recess process (e.g., chemical oxide removal (COR) or buffered hydrofluoric acid (BHF)), which allows for continued scaling to smaller gate pitches. The methods enable trenches between gates with small gate pitches to be successfully filled without voiding or gate damage. In some embodiments, a selective gate hard mask etching process is employed after filling the trenches. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

Figure 2B:
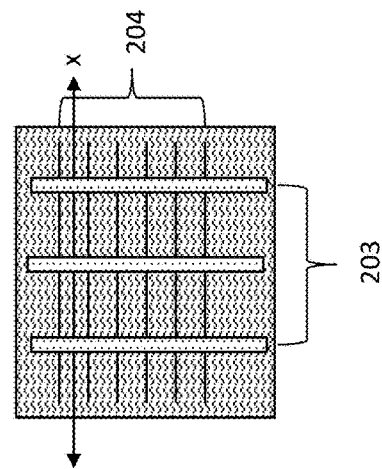
FIG. 2B is a top view of FIG. 2A.
Figure 2A:
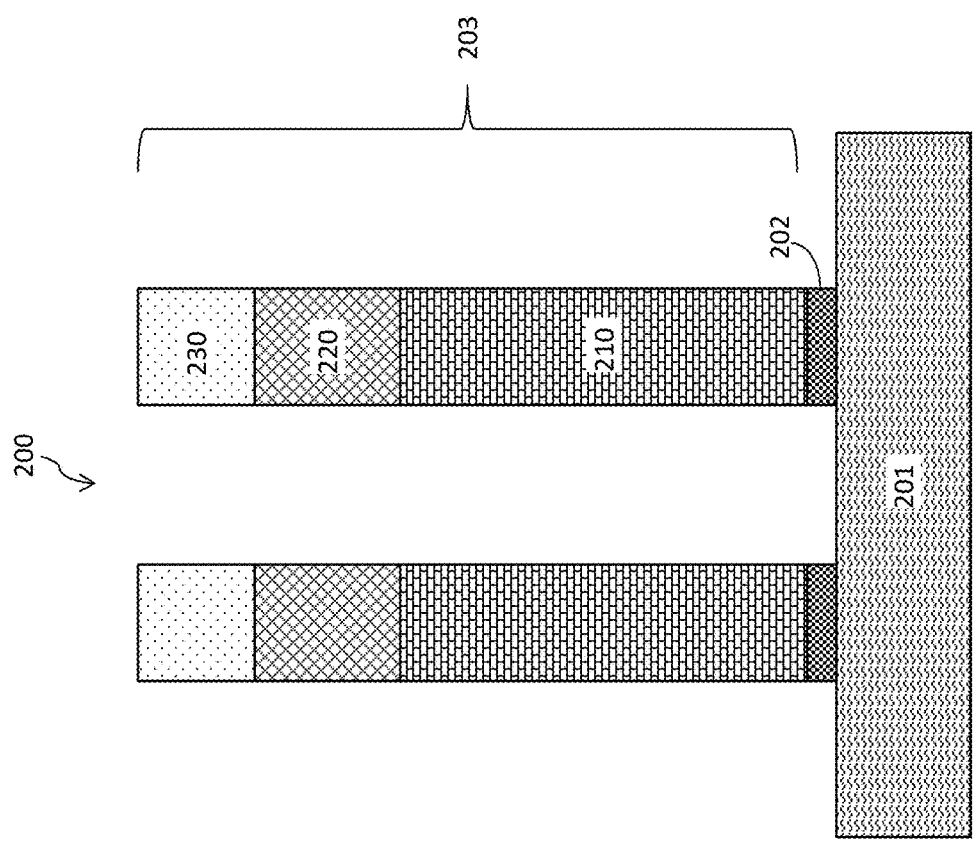

Turning again to the Figures, FIGS. 2A-10B illustrate exemplary methods of making semiconductor devices according to various embodiments. FIG. 2A is a cross-sectional side view of a semiconductor device 200 with dummy gates 203 (sacrificial gates) (first dummy gate and second dummy gate) formed over a substrate 201. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. The type of substrate 201 material depends on the type of transistor, e.g., an n-type field effect transistor (NFET) or p-type field effect transistor (PFET).

In some embodiments, the semiconductor device 200 is a FinFET. As shown in FIG. 2A, a fin 204 is patterned in the substrate 201, and the dummy gates 203 are disposed over the fin 204 (fin channel). FIG. 2A is a cross-section through the x-axis of FIG. 2B.

To form the dummy gates 203, various layers are formed/disposed over the substrate 201 and patterned. The dummy gates 203 include a dielectric material layer 202, a dummy gate material 210, a first hard mask layer 220, and a second hard mask layer 230.

The dielectric material layer 202 is arranged between the substrate 201 and the dummy gate material 210. The dielectric material layer 202 is deposited by a deposition process, including, but not limited to chemical vapor deposition (CVD), physical vapor deposition (PVD), plasma enhanced CVD (PECVD), atomic layer deposition (ALD), evaporation, chemical solution deposition, or like processes. Non-limiting examples of suitable materials for the dielectric material layer 202 include oxides, e.g., silicon dioxide, oxynitrides, e.g., silicon oxynitride, nitrides, e.g., silicon nitride, or any combination thereof.

The thickness of the dielectric material layer 202 (a sacrificial oxide) generally varies and is not intended to be limited. In some embodiments, the thickness of the dielectric material layer 202 is in a range from about 3 to about 8 nanometers (nm). The dielectric material layer 202 layer is a sacrificial oxide that will be removed prior to replacing the dummy gate material with a high-k metal gate.

The dummy gate material 210 is disposed over the dielectric material layer 202. The dummy gate material 210 is deposited using a deposition process, including, but not limited to, PVD, CVD, PECVD, inductively coupled plasma chemical vapor deposition (ICP CVD), or any combination thereof. Non-limiting examples of materials for the dummy gate material 210 include sacrificial gate materials, for example, amorphous silicon (aSi), polycrystalline silicon (polysilicon), or a combination thereof.

The thickness of the dummy gate material 210 (dummy gate height) generally varies and is not intended to be limited. In some embodiments, the thickness of the dummy gate material 210 is in a range from about 50 to about 150 nanometers (nm).

The first hard mask layer 220 is disposed over the dummy gate material 210. Non-limiting examples of materials for the first hard mask layer 220 include nitrides, for example, silicon nitride (SiN), or other material that is resistant to SiBCN etch chemistry. First hard mask layer 220 may be deposited using a deposition process, including, but not limited to, PVD, CVD, PECVD, or any combination thereof.

The thickness of the first hard mask layer 220 generally varies and is not intended to be limited. In some embodiments, the thickness of first hard mask layer 220 is in a range from about 15 to about 50 nanometers (nm).

In some embodiments, a second hard mask layer 230 is disposed over the first hard mask layer 220. In other embodiments, the second hard mask layer 230 is not included. The first hard mask layer 220 may be deposited using a deposition process, including, but not limited to, PVD, CVD, PECVD, or any combination thereof. Non-limiting examples of materials for the second hard mask layer 230 include oxides (e.g., silicon dioxide), nitrides (e.g., SiN), or any combination thereof. In some embodiments, the second hard mask layer 230 is an oxide layer.

The thickness of the second hard mask layer 230 generally varies and is not intended to be limited. In some embodiments, the thickness of second hard mask layer 230 is in a range from about 30 to about 80 nanometers (nm).

After forming a stack over the substrate 201, the dielectric material layer 202, the dummy gate material 210, the first hard mask layer 220 and the second hard mask layer 230 are patterned and etched to form the dummy gates 203. For example, a photoresist (not shown) may be disposed over the second hard mask layer 230 and patterned by exposing the photoresist to a desired pattern of radiation. Then the exposed photoresist is developed and with a resist developer to provide a patterned photoresist over the second hard mask layer 230. The photoresist pattern is transferred through the dielectric material layer 202, the dummy gate material 210, the first hard mask layer 220 and the second hard mask layer 230 by performing a suitable etching process. Then the photoresist is removed.

Figure 3:
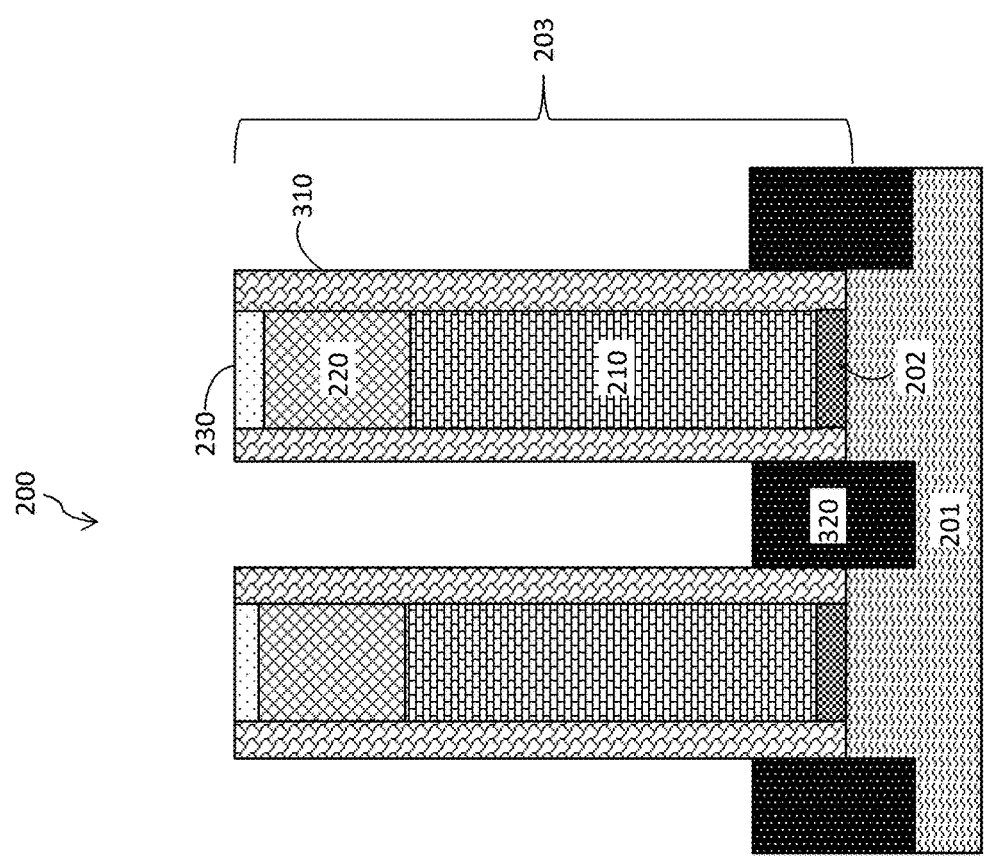

FIG. 3 is a cross-sectional side view after forming gate spacers 310 along a sidewall of the dummy gates 203 and active regions 320 (source/drain regions) between the dummy gates 203. To form the gate spacers 310, an insulating dielectric spacer material is deposited over the dummy gates 203. The spacer material is deposited using a deposition process, for example, CVD, PVD, PECVD, or any combination thereof. The spacer material may be any dielectric spacer material. Non-limiting examples of suitable materials for the gate spacers 310 include oxides (e.g., silicon dioxide), nitrides (e.g., SiN), SiOCN, SiBCN, or any combination thereof. In some embodiments, a first gate spacer is formed along a sidewall of the first dummy gate and a second gate spacer is formed along a sidewall of the second dummy gate.

The deposited spacer material may be etched by a dry anisotropic etching process, for example, a reactive ion etching (RIE) process. The dry anisotropic etching process employed to form the gate spacers 310 also may reduce the thickness of the second hard mask layer 330.

The thickness (width) of gate spacers 310 generally varies and is not intended to be limited. In some embodiments, the thickness of the gate spacers 310 is in a range from about 5 to about 15 nanometers (nm).

The active regions 320 may be formed by performing an epitaxial growth process on exposed fins after spacer formation and etch. Alternatively, the active regions 320 may be formed by incorporating dopants into the substrate 201.

An epitaxial growth process is performed to deposit a crystalline layer onto the crystalline substrate 201 beneath. The active regions 320 are grown on the fin channels to form source/drain contacts. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor.

The epitaxial layers forming the active regions 320 may be grown using a suitable growth process, for example, CVD, liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Figure 4:
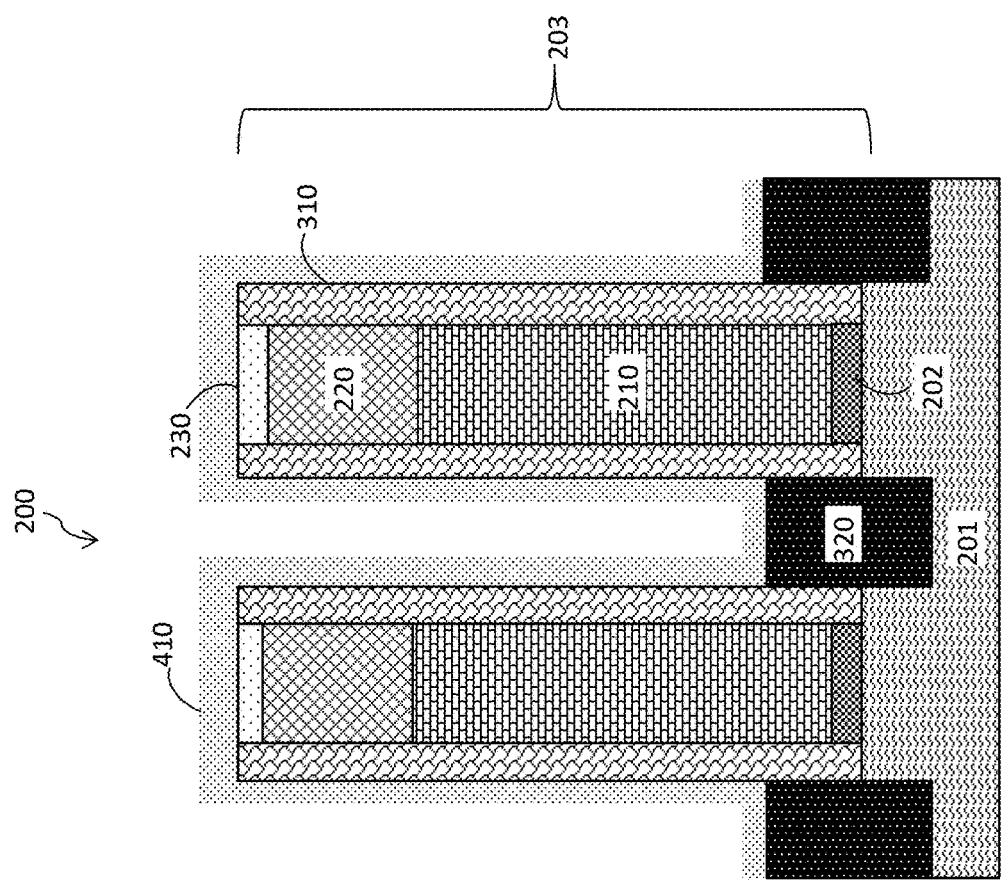

FIG. 4 is a cross-sectional side view after disposing a conformal liner 410 over the dummy gates 203 and active regions 320. The conformal liner 410 may be deposited using a deposition process, for example, CVD, PVD, PECVD, or any combination thereof. The conformal liner 410 can be a dielectric spacer material. Non-limiting examples of suitable materials for the conformal liner 410 include SiN, SiOCN, SiBCN, or any combination thereof. In some embodiments, the conformal liner 410 includes the same material as the gate spacers 310. The conformal liner 410 includes a material that is different than the first hard mask layer 220 to prevent removing or etching the conformal liner 410 when the first hard mask layer 220 is subsequently etched, as described in FIG. 9.

The thickness of the conformal liner 410 generally varies and is not intended to be limited. In some embodiments, the thickness of the conformal liner 410 is in a range from about 2 to about 8 nanometers (nm). In other embodiments, the thickness of the conformal liner 410 is in a range from about 1 to about 5 nm. Still yet, in other embodiments, the thickness of the conformal liner 410 is about half of the thickness of the gate spacers 310.

Figure 5:
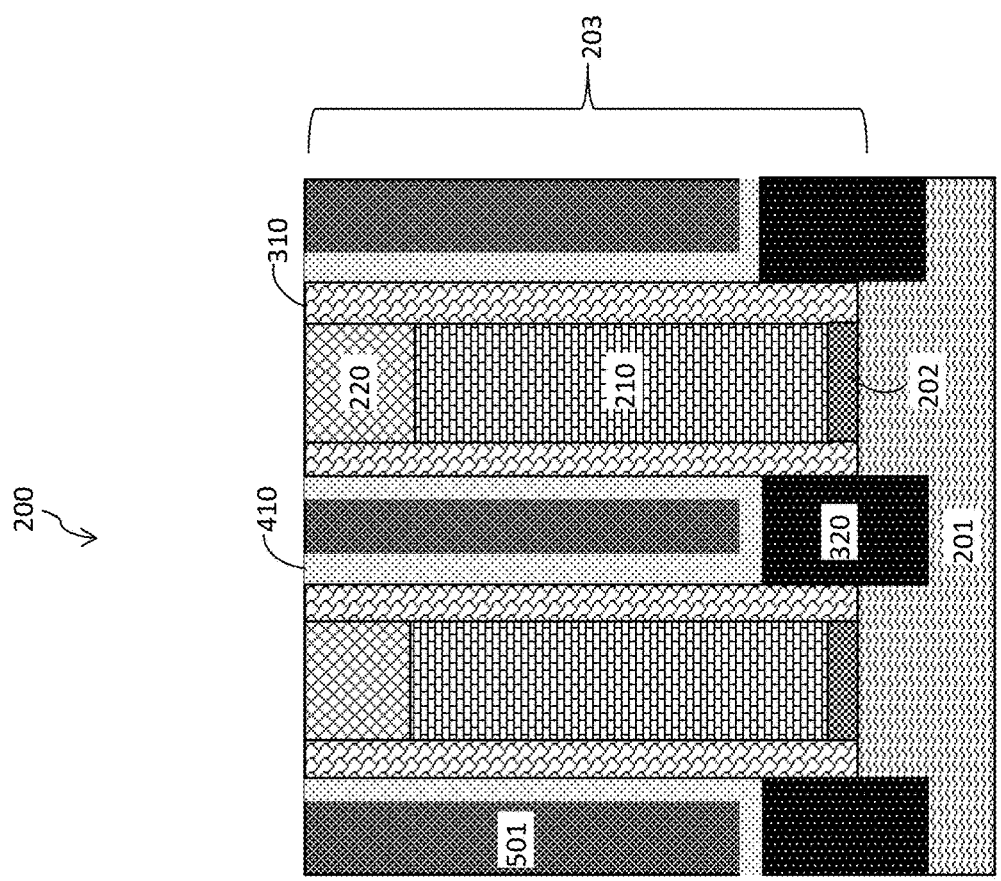

FIG. 5 is a cross-sectional side view after disposing an oxide 501 around the dummy gates 203 and performing a planarization process. The oxide 501 may be deposited by a deposition process, including, but not limited to CVD, PVD, PECVD, ALD, evaporation, chemical solution deposition, or like processes. Non-limiting examples of materials for the oxide 501 include tetraethylorthosilicate (TEOS) oxide, high aspect ratio plasma (HARP) oxide, high temperature oxide (HTO), high density plasma (HDP) oxide, silicon dioxide, flowable oxide (FOX), or any combination thereof.

After the oxide 501 is disposed onto and around the dummy gates 203, the planarization process is performed to polish/smooth the surface of the oxide 501 and expose the first hard mask layer 220. The second oxide layer 230 (when present) is removed during planarization. The planarization process may include, for example, a chemical mechanical planarization (CMP) process, a gas cluster ion beam (GCIB) process, a non-selective reactive ion etch (RIE) process, or any combination thereof.

Figure 6:
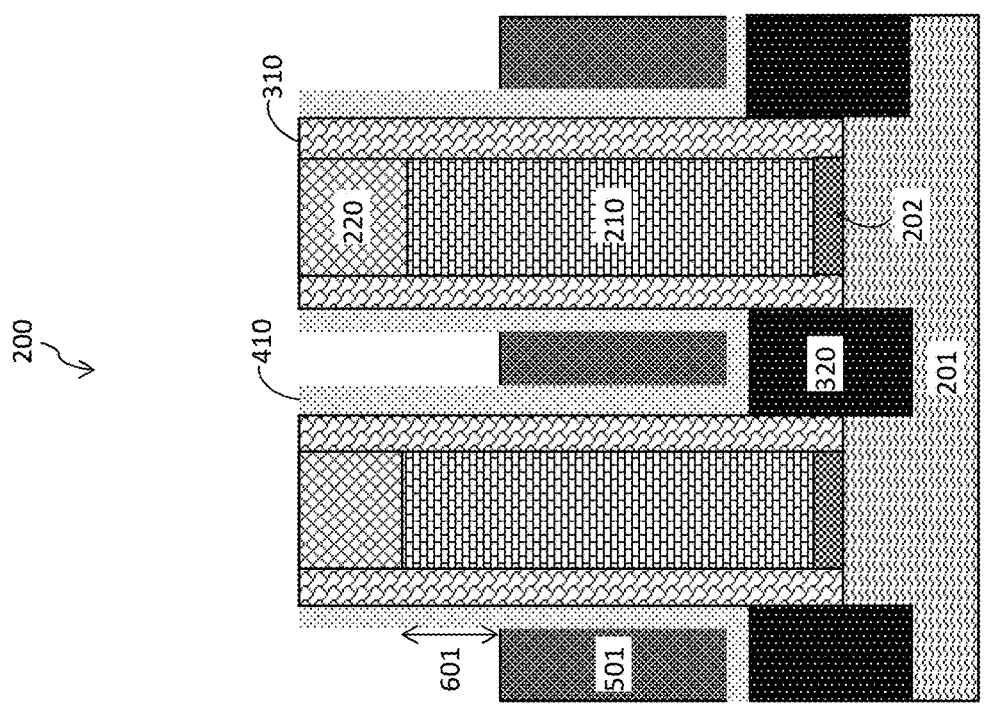

FIG. 6 is a cross-sectional side view after selectively recessing the oxide 501. To recess the oxide 501, an etching process that is selective to (will not remove) the first hard mask layer 220 is employed. Recessing the oxide 501 exposes the conformal layer 410.

The oxide 501 may be recessed using a dry etching process, for example, a RIE process, a plasma etching process (e.g., a remote plasma assisted dry etch process that includes simultaneous exposure to $H_2$, $NF_3$, and $NH_3$ plasma by-products (SiConi process)), a chemical oxide removal (COR) process, or any combination thereof. The oxide 501 may be recessed using a wet etching process that includes, for example, hydrofluoric acid (HF), buffered hydrofluoric acid (BHF), hydrofluoric nitric acid (HNA), phosphoric acid, or any combination thereof.

The oxide 501 is recessed to a level that is below the first hard mask layer 220. The amount of oxide 501 removed to recess the below the first hard mask layer 220 depends on the device scaling and dimensions. In some embodiments, the oxide 501 is recessed by an amount 601 that is about 15 to about 25 nm below the first hard mask layer 220. In other embodiments, the oxide 501 is recessed by an amount 601 that is about 40 to about 60 nm below the first hard mask layer 220.

Figure 7:
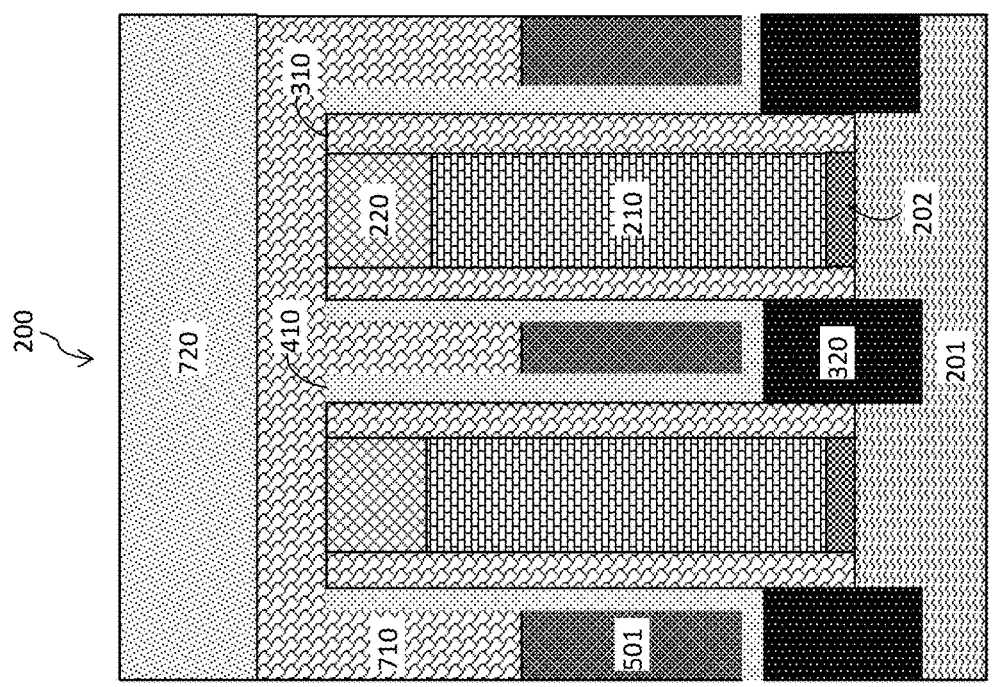

FIG. 7 is a cross-sectional side view after disposing a layer 710 including the spacer material and a planarization layer 720 over the recessed oxide 501. In some embodiments, gate spacer 310 includes SiBCN, and layer 710 includes SiBCN. In other embodiments, gate spacer 310 includes SiOCN, and layer 710 includes SiOCN. Yet, in other embodiments, the gate spacer 310 includes the same material as layer 710.

Layer 710 is formed using a conformal deposition process, for example, an ALD process or a molecular layer deposition (MLD) process. The layer 710 is deposited such that it has a thickness that extends over the first hard mask layer 220. The layer 710 is formed to fill the recessed trenches and to form a cap to help with planarization. In some embodiments, the thickness of the layer 710 is in a range from about 150 to about 200 nm.

The planarization layer 720 is disposed over the layer 710. The planarization layer 720 may include, for example, a planarizing oxide material such as TEOS oxide, HARP oxide, HTO, HDP oxide, or any combination thereof.

Figure 8:
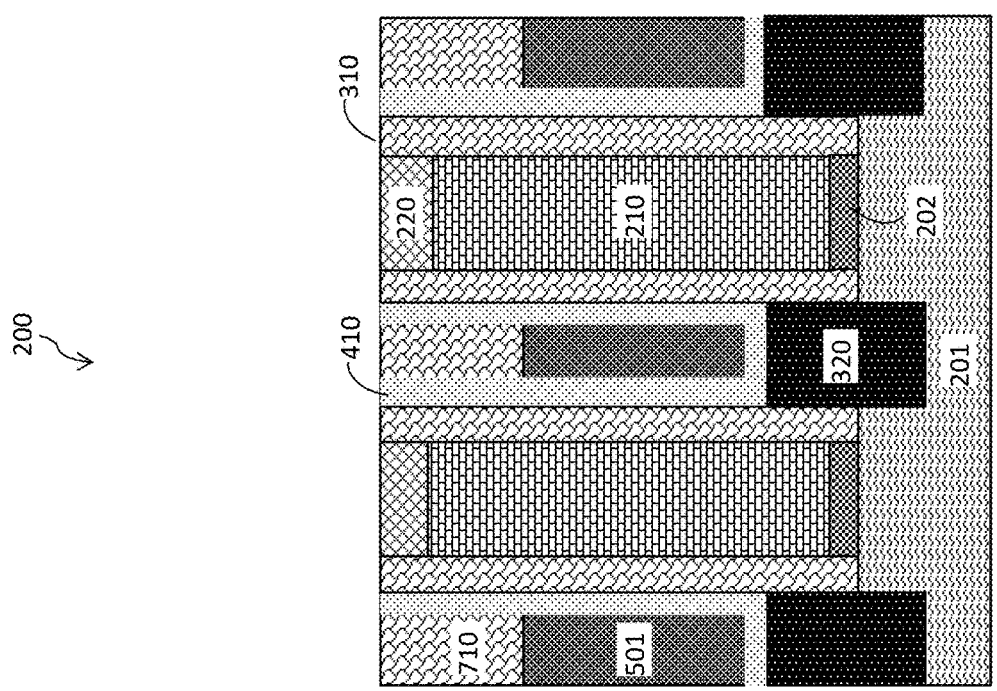

FIG. 8 is a cross-sectional side view after performing planarization process to expose the first hard mask layer 220. A first planarization process is a process that removes the planarization layer 720 and at least some of layer 710. A second planarization process is a CMP process that removes enough of the layer 710 to expose the first hard mask layer 220. The CMP process may be a selective process that stops on first hard mask layer 220. The second planarization process may include a dry etching process, for example, a CMP process, a GCIB process, a non-selective ME, or any combination thereof. In some embodiments, the second planarization process includes a timed etching process.

Figure 9:
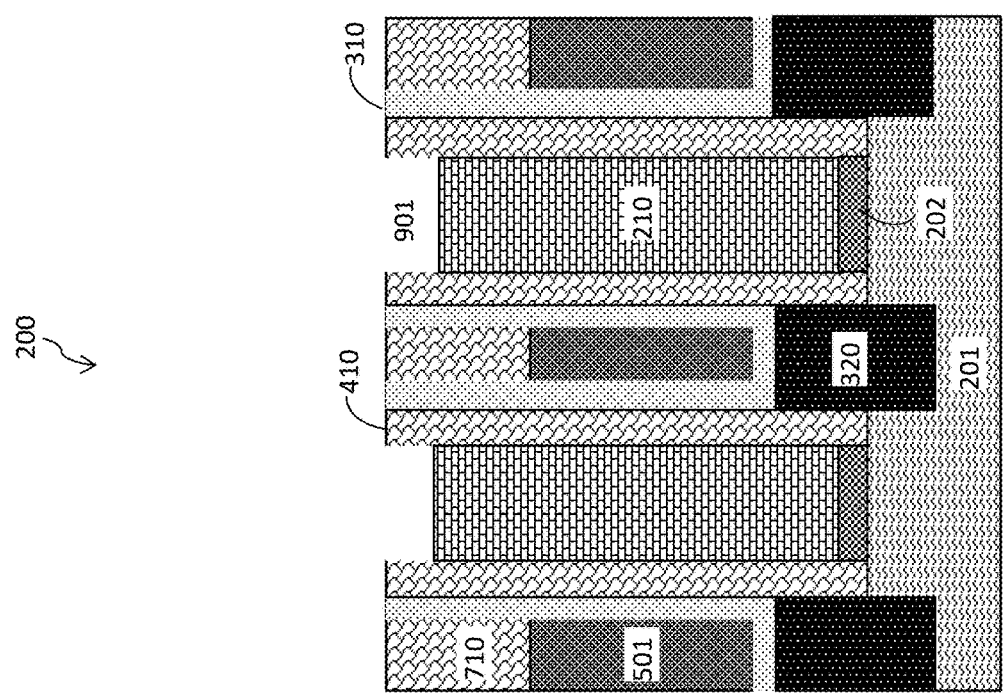

FIG. 9 is a cross-sectional side view after selectively removing the first hard mask layer 220 to expose the dummy gate material 210. The first hard mask layer 220 may be removed by a wet etching process that is selective to (will not remove) layer 710 and/or gate spacers 310. The first hard mask layer 220 may be removed by methods that include, for example, HF diluted by ethylene glycol (HFEG). The first hard mask layer 220 may be removed by a dry etching process that is selective to layer 710 and/or gate spacers 310 and includes, for example, a COR process or a RIE process.

Figure 10A:
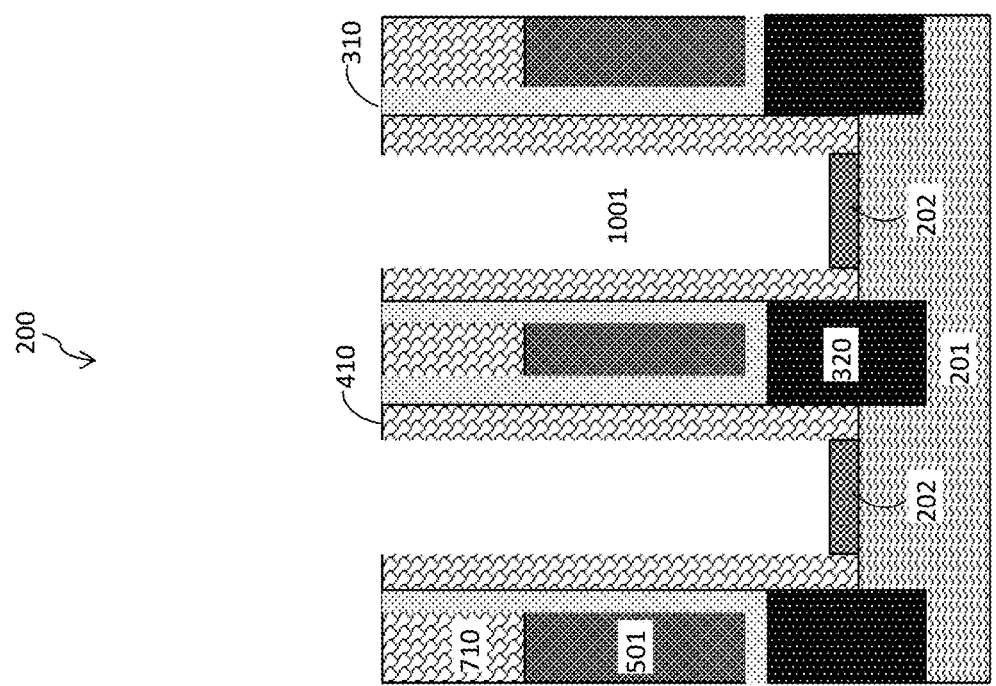
FIG. 10A is a cross-sectional side view after removing the sacrificial gate material within the dummy gates.

FIG. 10A is a cross-sectional side view after removing (pulling) the dummy gate material 210 to expose the dielectric material layer 202 and form gate trenches 1001. The dummy gate material 210 may be removed by employing a wet etching process that includes, for example ammonium hydroxide, tetramethyl ammonium hydroxide (TEAH), or any combination thereof. The dummy gate material 210 may be removed by employing a an etching process that includes, for example plasma etching or chemical etching.

Figure 10B:
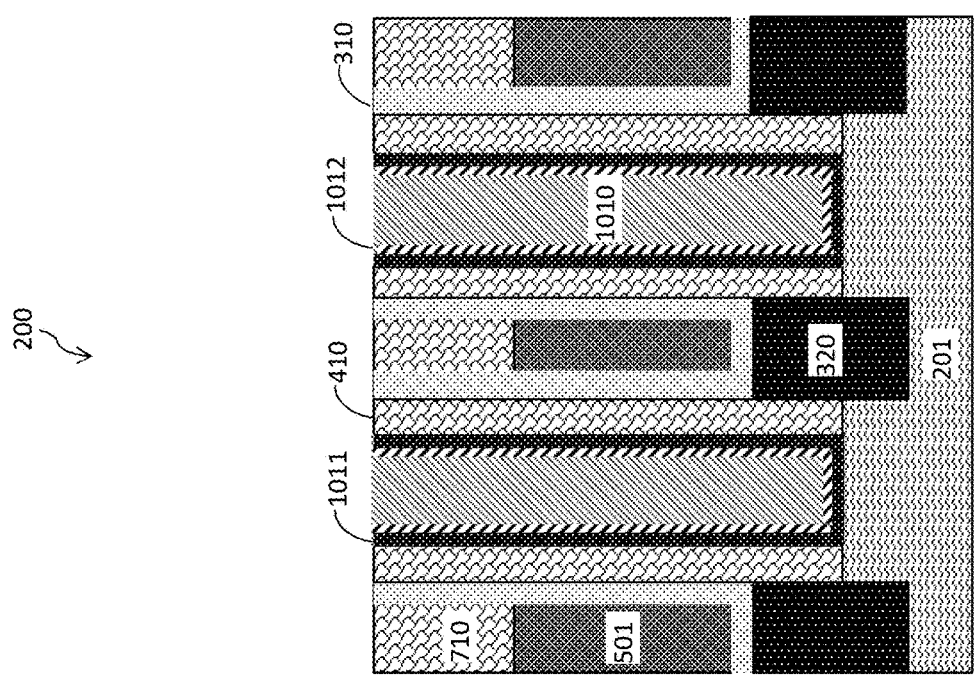

FIG. 10B is a cross-sectional side view filling the gate trenches 1001 with a high-k metal gate stack 1010. The dielectric gate material 202 is removed and replaced with a high-k oxide 1011, as described below. The high-k metal gate stack includes high-k metal gates formed, for example, by filling the gate trenches 1001 with one or more high-k dielectric materials or oxides (high-k oxide 1011), one or more workfunction metals 1012, and one or more metal gate conductor materials 1010.

The high-k dielectric material(s) can be a dielectric material having a dielectric constant greater than 4.0, 7.0, or 10.0 (e.g., $HfO_2$). Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The high-k dielectric material layer may be formed by suitable deposition processes, for example, CVD, PECVD, ALD, PVD, chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. Non-limiting examples of suitable work function metals include p-type work function metal materials and n-type work function metal materials. P-type work function materials include compositions such as ruthenium, palladium, platinum, cobalt, nickel, titanium, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. In some embodiments, the same metal is used in both high-k gate stacks (e.g., titanium).

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, CMP, is performed to polish the surface of the conductive gate metal.

EXAMPLES

Figure 11A:
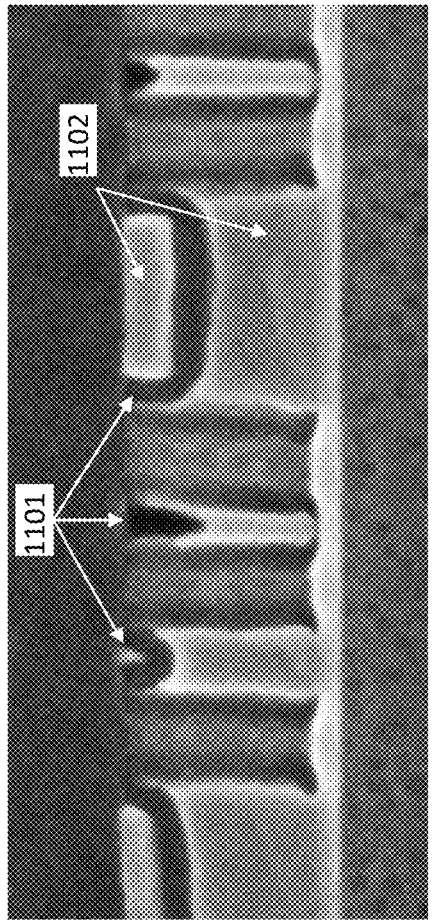
FIG. 11A is an electron micrograph image of SiBCN filling over recessed FOX layers.
Figure 11B:
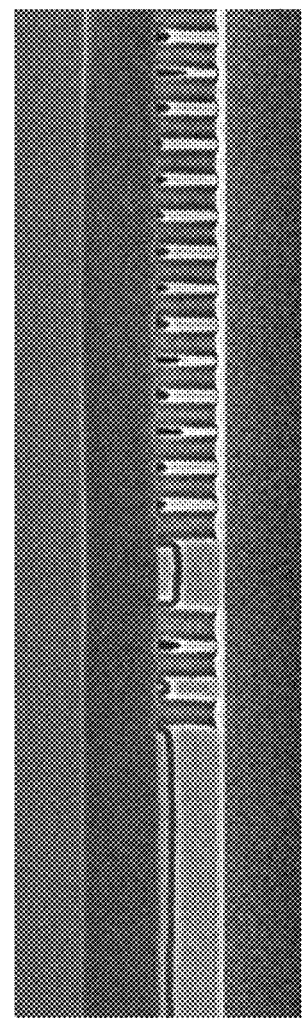
FIG. 11B is a lower magnification view of FIG. 11A.

FIGS. 11A and 11B are electron micrograph images showing SiBCN 1101 filling recessed FOX layers 1102 (see also, FIG. 6). FIG. 11B is a lower magnification view of FIG. 11A. As shown, conformal SiBCN fills high aspect ratio trenches, which does not void and is selective to a silicon nitride hard mask.

Figure 12A:
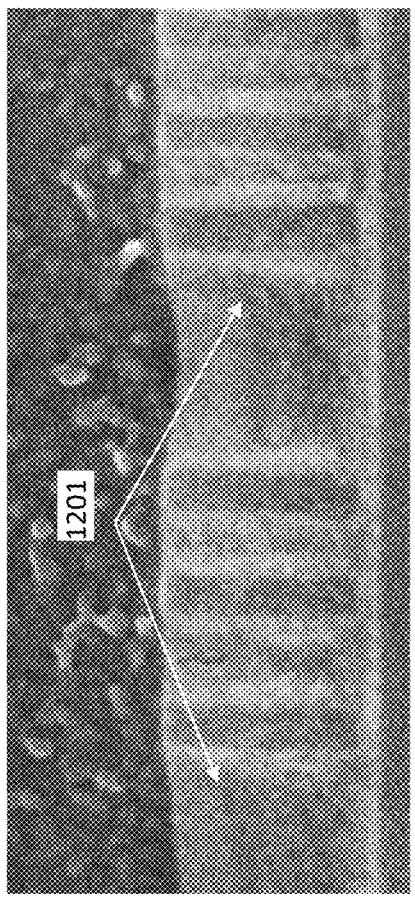
FIG. 12A is an electron micrograph image of a FOX/SiBCN interface between gates without voids.
Figure 12B:
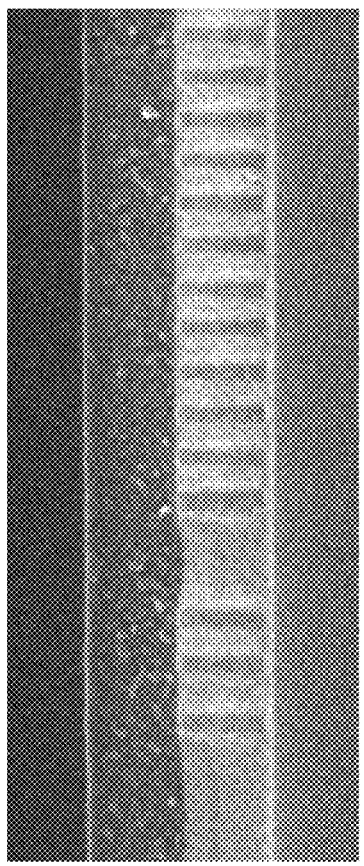
FIG. 12B is a lower magnification view of FIG. 12A.

FIGS. 12A and 12B are electron micrograph images showing of a FOX/SiBCN interface 1201 between gates without voids. FIG. 12B is a lower magnification view of FIG. 12A. The images shown in FIGS. 12A and 12B are shown from the same sample location as FIGS. 11A and 11B but were prepared without a "highlight or decoration" process that smoothes the surface and shows the SiBCN liner and FOX more easily. SiBCN liner fill post FOX recess is also shown. As shown, no voids form within the SiBCN liner.

As described above, various embodiments described herein provide a trench filling process between gates that maintains an intact gate profile and substantially completely fills recessed oxide trenches without voids. The methods include a conformal deposition process that fills high aspect ratio trenches without damaging dummy gate spacers or hard masks. The conformal deposition process is combined with a highly selective oxide recess process (e.g., chemical oxide removal (COR) or buffered hydrofluoric acid (BHF)), which allows for continued scaling to smaller gate pitches. The methods enable trenches between gates with small gate pitches to be successfully filled without voiding or gate damage. In some embodiments, a selective gate hard mask etching process is employed after filling the trenches.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of filling trenches between gates, the method comprising:
    forming a first dummy gate and a second dummy gate over a substrate, the first dummy gate and the second dummy gate comprising a sacrificial gate material and a hard mask layer on the sacrificial gate material;
    forming a first gate spacer along a sidewall of the first dummy gate and a second gate spacer along a sidewall of the second dummy gate;
    performing an epitaxial growth process to form a source/drain on the substrate between the first dummy gate and the second dummy gate;
    disposing a conformal liner over the first dummy gate, the second dummy gate, and the source/drain;
    disposing an oxide on the conformal liner between the first dummy gate and the second dummy gate;
    recessing the oxide to a level below the hard mask layer on the first dummy gate and the second dummy gate to form a recessed oxide;
    disposing a spacer material layer over the recessed oxide and the hard mask layer;
    disposing a planarization layer over the spacer material layer; and
    performing a planarization process to remove the planarization layer and a portion of the spacer material layer and to expose the hard mask layer;
    wherein the performing the planarization process comprises a first planarization process that selectively stops on the spacer material layer and a second planarization process that exposes the hard mask layer.

2. The method of claim 1, wherein recessing the oxide comprises performing an etching process that is selective to the hard mask layer.

3. The method of claim 1, further comprising selectively removing the hard mask layer after the hard mask layer is exposed.

4. The method of claim 3, further comprising removing the sacrificial gate material.

5. The method of claim 3, wherein selectively removing the hard mask layer comprises an etching process that is selective to the spacer material layer, the first gate spacer, and the second gate spacer.

6. The method of claim 3, wherein the hard mask layer comprises silicon nitride, and the conformal liner comprises SiBCN.

7. The method of claim 3, wherein the first dummy gate and the second dummy gate further comprise an oxide layer disposed on the hard mask layer.

8. The method of claim 3, wherein the conformal liner is a dielectric spacer material.

9. The method of claim 3, wherein the conformal liner is SiN, SiOCN, or SiBCN.

10. The method of claim 3, wherein the first gate spacer, the second gate spacer, and the spacer material over the recessed oxide include the same material.

11. The method of claim 3, wherein the conformal liner has a thickness in a range from about 1 to about 5 nm.

12. The method of claim 3, wherein recessing the oxide is a dry etching process.

13. The method of claim 3, wherein the oxide is recessed by an amount that is about 15 to about 25 nanometers (nm) below the hard mask layer of the first dummy gate.

* * * * *